United States Patent

Van Der Wel et al.

[11] Patent Number: 5,824,560
[45] Date of Patent: Oct. 20, 1998

[54] METHOD OF MANUFACTURING A SEMICONDUCTOR DEVICE WITH BICMOS CIRCUIT

[75] Inventors: Willem Van Der Wel; Alexander C. L. Jansen, both of Nijmegen; Ronald Koster, Eindhoven, all of Netherlands; Armand Pruijmboom, Albuquerque, N. Mex.

[73] Assignee: U.S. Philips Corporation, New York, N.Y.

[21] Appl. No.: 623,383

[22] Filed: Mar. 27, 1996

[30] Foreign Application Priority Data

Mar. 28, 1995 [EP] European Pat. Off. ............. 95200773

[51] Int. Cl.⁶ ................................. H01L 21/265
[52] U.S. Cl. ............................. 437/31; 437/59; 437/186; 437/191; 437/193; 148/DIG. 9
[58] Field of Search .............................. 437/59, 186, 191, 437/193; 148/DIG. 9

[56] References Cited

U.S. PATENT DOCUMENTS

| | | | |
|---|---|---|---|
| 4,635,347 | 1/1987 | Lien et al. | 29/591 |
| 4,752,589 | 6/1988 | Schaber | 437/31 |
| 4,764,482 | 8/1988 | Hsu | 437/57 |
| 5,001,081 | 3/1991 | Tuntasood et al. | 437/59 |
| 5,124,817 | 6/1992 | Brassington et al. | 357/43 |
| 5,132,234 | 7/1992 | Kim et al. | 148/DIG. 9 |
| 5,171,702 | 12/1992 | Prengle et al. | 148/DIG. 9 |
| 5,179,031 | 1/1993 | Brassington et al. | 148/DIG. 9 |
| 5,196,356 | 3/1993 | Won et al. | 148/DIG. 9 |
| 5,422,290 | 6/1995 | Grubisch | 437/34 |
| 5,449,637 | 9/1995 | Satio et al. | 437/57 |
| 5,480,830 | 1/1996 | Liao et al. | 437/58 |
| 5,512,497 | 4/1996 | Ikeda et al. | 437/59 |

FOREIGN PATENT DOCUMENTS

0381071A2  8/1990  European Pat. Off. ........ H01L 21/22

OTHER PUBLICATIONS

"A Fully Complementary BiCMOS Technology for Sub-Half Micrometer Microprocessor Applications" by IEEE Transactions on Electron Devices, vol. 39, No. 12, Dec. 1992, pp. 2733–2739.

Primary Examiner—David Graybill
Assistant Examiner—Long Pham
Attorney, Agent, or Firm—Steven R. Biren

[57] ABSTRACT

A method of manufacturing a semiconductor device with a bipolar transistor (1) and a MOS transistor (2) formed in a silicon body (3) which for this purpose is provided with a field insulation region (4) by which semiconductor regions (6, 7) adjoining a surface (5) of said body are mutually insulated. A first region (6) is to be used for the bipolar transistor and a second region for the MOS transistor. The two regions are provided in that order with a gate dielectric layer (10) and an auxiliary layer (11) of non-crystalline silicon. The auxiliary layer and the gate dielectric layer are subsequently removed from the first region. Then an electrode layer (13) of non-crystalline silicon is deposited. An emitter electrode (15) is formed in the electrode layer on the first region, and a gate electrode (16) is formed both in the electrode layer and in the auxiliary layer on the second region. The electrode layer is subjected to a treatment whereby non-crystalline silicon is removed and whereby a layer of non-crystalline silicon is formed on the surface of the silicon body which has substantially the same thickness at the area of the first region and at the area of the second region. Overetching of the base zone (9) in the formation of the emitter is avoided thereby, so that the base zone may be comparatively thin.

4 Claims, 5 Drawing Sheets

METHOD OF MANUFACTURING A SEMICONDUCTOR DEVICE WITH BICMOS CIRCUIT

BACKGROUND OF THE INVENTION

The invention relates to a method of manufacturing a semiconductor device with a bipolar transistor and a MOS transistor which are formed in a silicon body which is for this purpose provided with a field insulation region by which semiconductor regions adjoining a surface of said body are mutually insulated, with a first region for the bipolar transistor and a second region for the MOS transistor, after which the two regions are consecutively provided with a gate dielectric layer and an auxiliary layer of non-crystalline silicon, whereupon the auxiliary layer and the gate dielectric layer are removed from the first region, and subsequently an electrode layer of non-crystalline silicon is deposited and an emitter electrode is formed in the electrode layer on the first region and a gate electrode is formed both in the electrode layer and in the auxiliary layer on the second region.

A semiconductor device with a single bipolar transistor and a single MOS transistor can be manufactured by such a method. In practice, however, the method will be used for the manufacture of a semiconductor device comprising an integrated circuit with a large number of bipolar and MOS transistors. The circuit then may comprise both NPN and PNP bipolar transistors, as well as MOS transistors of the N-channel and P-channel type. Such an integrated circuit which comprises besides bipolar transistors also NMOS and PMOS transistors is called integrated BiCMOS circuit.

After the emitter electrode has been formed on the first semiconductor region, the emitter zone of the bipolar transistor is formed from the doped emitter electrode, which lies immediately against the surface of the silicon body, through diffusion into the base zone. The gate electrode formed on the second region may, as is usual, be used as a mask during the implantation of ions for forming source and drain zones of the MOS transistor in the second region.

The auxiliary layer of non-crystalline silicon which is formed on the gate dielectric layer serves to protect the gate dielectric on the second region when the auxiliary layer and the gate dielectric layer on the first region are being removed. To remove the auxiliary layer and the gate dielectric from the first region, a photoresist mask is provided in practice which covers the auxiliary layer at the area of the second region, after which an etching treatment is carried out in an etching plasma. The use of the auxiliary layer has the result that both the photoresist mask and the etching plasma do not come into contact with the gate dielectric layer.

U.S. Pat. No. 5,124,817 discloses a method of the kind mentioned in the opening paragraph whereby also an emitter island is formed in a self-aligned manner during the formation of the emitter electrode and the gate electrode. The emitter electrode is etched into a layer of non-crystalline silicon which is thicker than the layer of non-crystalline silicon into which the gate electrode is etched. The emitter electrode is etched into the electrode layer only, the gate electrode into the electrode layer and the subjacent auxiliary layer. During etching away of the auxiliary layer next to the gate electrode, silicon is etched away also from the first region situated next to the emitter electrode formed. Thus the emitter electrode is formed on a silicon island, the emitter island mentioned above.

The emitter zone is formed through diffusion of dopant atoms from the emitter electrode, an emitter-base junction being formed which remains within the emitter island formed. The transistor formed will accordingly have a comparatively small emitter-base capacitance. During the formation of the emitter island, during which silicon is etched away from adjacent the emitter electrode, the base zone of the transistor is in fact etched away over part of its thickness. The base zone must be made comparatively thick in order to prevent that the base zone is etched away through its entire thickness then next to the emitter electrode. A small emitter-base capacitance gives a bipolar transistor favorable high-frequency properties, but these are more than wiped out by a comparatively thick base zone.

SUMMARY OF THE INVENTION

The invention has for its object inter alia to provide a method of manufacturing a semiconductor device with a bipolar transistor and a MOS transistor whereby a bipolar transistor with a comparatively thin base zone can be formed. According to the invention, the method mentioned in the opening paragraph is for this purpose characterized in that, before the emitter electrode and the gate electrode are formed, the electrode layer is subjected to a treatment whereby non-crystalline silicon is removed and whereby a layer of non-crystalline silicon is formed at the surface of the silicon body, which layer has substantially the same thickness at the areas of the first and second regions.

In this method, the gate electrode and the emitter electrode are formed in a layer of non-crystalline silicon of practically uniform thickness. When etching of the layer of non-crystalline silicon is stopped the moment the gate dielectric is reached, the base zone of the bipolar transistor is also exactly reached at that same moment. The etching treatment is continued for a short time in practice after the gate dielectric has been reached to ensure that the electrode layer has been fully removed from the base zone after the etching treatment. A slight overetching is used. Etching of the base zone situated next to the emitter zone, however, has been reduced to a minimum thereby. The base zone may be very thin therefore.

After the deposition of the electrode layer, a thicker layer of non-crystalline silicon is present at the area of the second region than at the area of the first region. In the method according to the invention, the electrode layer is subjected to a treatment whereby a layer of non-crystalline silicon of homogeneous thickness is formed on the surface of the silicon body. This could be done in a comparatively expensive manner through the use of an additional photoresist mask which covers the first region, whereupon the electrode layer on the second region could be etched.

Preferably, however, the treatment of the electrode layer whereby a layer of non-crystalline silicon of homogeneous thickness is formed on the surface of the silicon body is combined with a treatment of the electrode layer whereby the latter is locally, i.e. at the area of the first region, provided with a dopant from which the emitter of the bipolar transistor can be formed through diffusion. These two treatments may be carried out with only a single photoresist mask. The necessity of using said very expensive additional masking step has thus been avoided.

The electrode layer is locally, at the area of the first region, provided with a dopant from which the emitter of the bipolar transistor can be formed through diffusion. Outside the first region, the electrode layer is not provided with a dopant during this treatment. The gate electrode, which is formed in the electrode layer at the area of the second region, may in this case be doped during a process step in which the source and drain zones of the MOS transistor are formed.

In a first preferred embodiment, a dopant is provided in the electrode layer during the treatment of this layer at the area of the first region, whereupon a thermal oxidation treatment is carried out, after which the silicon oxide formed is subjected to an etching treatment until the electrode layer has become exposed again at the area of the second region, and the exposed electrode layer is subsequently subjected to an etching treatment until the auxiliary layer and the electrode layer together have reached the desired thickness at the area of the second region.

An oxidation treatment is carried out after the dopant has been provided in the electrode layer. Silicon oxide grows more quickly on the doped portion of the electrode layer than on the non-doped portion thereof during this treatment. A thicker layer of silicon oxide is accordingly formed on the doped portion of the electrode layer than on the non-doped portion. After the electrode layer next to the first region has become exposed again, a layer of silicon oxide will still be present on the electrode layer at the area of the first region. This layer of silicon oxide is used as a mask during the subsequent etching treatment whereby the auxiliary layer and the electrode layer together are brought to the desired thickness at the area of the second region.

In this first preferred embodiment, a photoresist mask is used for providing the electrode layer with said dopant at the area of the first region. The other steps subsequently proceed in a self-aligned manner.

In a second embodiment, the electrode layer is provided with a layer of silicon nitride at the area of the first region during the treatment of this electrode layer, after which a thermal oxidation treatment is carried out, whereupon the silicon nitride layer and the silicon oxide formed are etched away, the silicon oxide layer being provided to a thickness such that after removal of the silicon oxide layer the auxiliary layer and the electrode layer together have reached the desired thickness at the area of the second region.

A mask is used for providing the silicon nitride layer. A layer of silicon oxide is formed next to the silicon nitride layer, i.e. on the layer of non-crystalline silicon next to the first semiconductor region, during the thermal oxidation treatment. Then the silicon nitride layer is removed. The silicon oxide layer formed now shields the electrode layer next to the first semiconductor region, whereas the electrode layer is uncovered at the area of the first region. The silicon oxide layer may now be used as a mask during the provision of the dopant in the electrode layer at the area of the first region. The auxiliary layer and the electrode layer together are then brought to the desired thickness at the area of the second region through the subsequent removal of the oxide layer. The two above treatments of the electrode layer are carried out with only a single mask also in this embodiment.

BRIEF DESCRIPTION OF THE INVENTION

The invention will be explained in more detail below by way of example with reference to a drawing, in which:

FIGS. 1 to 6 diagrammatically and in cross-section show a few stages in the manufacture of a semiconductor device made by the method according to the invention, FIGS. 7 to 10 diagrammatically and in cross-section show a few stages in the manufacture of a semiconductor device made by a first embodiment of the method according to the invention, and FIGS. 11 to 14 diagrammatically and in cross-section show a few stages in the manufacture of a semiconductor device made by a second embodiment of the method according to the invention.

DETAILED DESCRIPTION OF THE PREFERRED EMBODIMENTS

Figure 1:
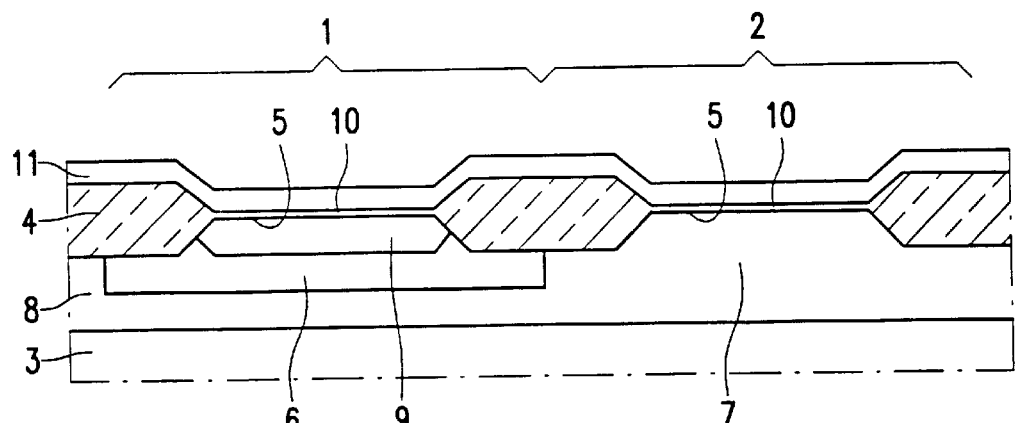

FIGS. 1 to 4 diagrammatically and in cross-section show a few stages in the manufacture of a semiconductor device with a bipolar transistor 1 and a MOS transistor 2. The bipolar transistor 1 in this example is an NPN transistor, the MOS transistor 2 an NMOS transistor. These transistors 1 and 2 are formed in a silicon body 3 which for this purpose is provided with a field insulation region 4 by which semiconductor regions 6 and 7 adjoining a surface 5 of the silicon body 3 are mutually insulated. Of these regions 6 and 7, a first region 6 is destined for the NPN transistor 1 and the second region 7 for the NMOS transistor 2. The second region 7 forms part of a surface layer 8 of the semiconductor body 3 and in this example is a P-type conducting epitaxially grown layer with a doping concentration of approximately $10^{16}$ atoms per cc. The semiconductor region 6 is formed in the surface layer 8 in a usual manner with an N-type doping with a concentration of approximately $10^{16}$ atoms per cc. In addition, a base zone 9 with a P-type doping with a concentration of approximately $10^{18}$ atoms per cc is formed in the first semiconductor region 6 destined for the bipolar transistor 1.

The two semiconductor regions 6 and 7 are subsequently provided with a gate dielectric layer 10, in this example an approximately 15 nm thick layer of thermal silicon oxide, and with an auxiliary layer 11 of non-crystalline silicon, in this example an approximately 50 nm thick layer of polycrystalline silicon.

In the next process step, the gate dielectric 10 and the auxiliary layer 11 are removed from the first semiconductor region 6, whereas the two layers 10 and 11 are maintained on the second region 7 for the NMOS transistor 2. The auxiliary layer 11 serves to protect the gate dielectric layer 10 on the second region 7 when the auxiliary layer 11 and the gate dielectric layer 10 are being removed from the first region 6. To remove the auxiliary layer 11 and the gate dielectric 10 from the first region, a photoresist mask 12 is provided which covers the auxiliary layer 11 at the area of the second region 7, after which a usual treatment is carried out in an etching plasma. The use of the auxiliary layer has the result that both the photoresist mask 12 and the etching plasma do not come into contact with the gate dielectric layer 10 on the second region 7.

An electrode layer 13 of non-crystalline silicon, in this example an approximately 200 nm thick layer of polycrystalline silicon, is provided on the surface 5 then. This layer 13 is subsequently subjected to a treatment whereby non-crystalline silicon is removed and whereby a layer 14 of non-crystalline silicon is formed on the surface 5 of the silicon body 3, this layer having substantially the same thickness over the first region 6 and the second region 7.

As will be described further below, the layer 14 is provided with a doping, in this example N-type, and is subsequently etched into a pattern with an emitter electrode 15 on the first semiconductor region 6 and a gate electrode 16 on the second semiconductor region 7.

After the emitter electrode 15 has been formed on the first semiconductor region 6, the N-type emitter zone 17 with a doping level of approximately $10^{20}$ atoms per cc of the bipolar transistor 1 is formed from the doped emitter electrode 15 which lies immediately against the surface 5 through diffusion into the P-type base zone 9. Then the emitter electrode 15 and gate electrode 16 are provided with lateral insulation portions or spacers 19 of silicon oxide in a usual manner. The gate electrode 16 with spacers 19 may be used, as is usual, as a mask during the ion implantation step in which source and drain zones 18 of the NMOS transistor 2 are formed with a doping level of approximately $10^{20}$ atoms per cc. Finally, the electrode 15 and 16, the base zone 9, and the source and drain zones 18 are provided with a top layer 20 of a metal silicide such as, for example, titanium or cobalt disilicide.

The emitter electrode 15 and the gate electrode 16 are etched in a layer 14 of non-crystalline silicon of substantially homogeneous thickness. When etching is stopped the moment the gate dielectric 10 is reached, the base zone 9 of the bipolar transistor 11 has also been exactly reached. The etching treatment is continued for a short time after the gate dielectric 10 has been reached in practice to ensure that the layer 14 has been fully removed from the base zone 9 after the etching treatment. A slight overetching is used. Etching of the base zone 9 situated next to the emitter electrode 15, however, is limited to a minimum. The base zone 9 may accordingly be very thin.

After deposition of the electrode layer 13, a thicker layer 11 and 13 of non-crystalline silicon is present at the area of the second region 7 than at the area of the first region. This layer is subjected to a treatment whereby a layer 14 of non-crystalline silicon of homogeneous thickness is formed on the surface 5. This could be done in a comparatively expensive manner through the use of an additional photoresist mask (not shown) which covers the first region 6, after which the electrode layer 12 could be etched on the second region 7.

Preferably, however, the treatment of the electrode layer 13 in which the layer 14 of homogeneous thickness is formed is combined with a treatment of the electrode layer 14 in which the latter is locally, i.e. at the area of the first region 6, provided with a dopant from which the emitter 17 of the bipolar transistor is formed through diffusion. As will become apparent below, these two treatments can be carried out with only a single photoresist mask. The necessity of using said very expensive additional masking step has thus been avoided.

Figure 3:
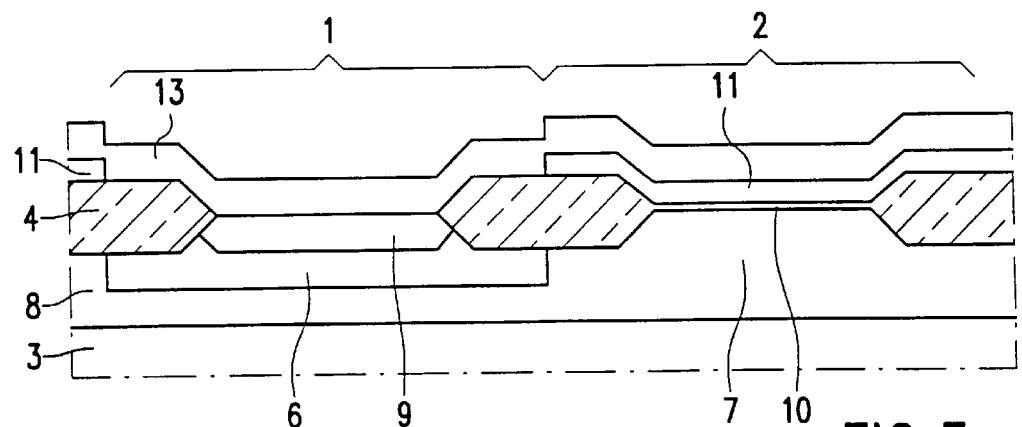
Figure 7:
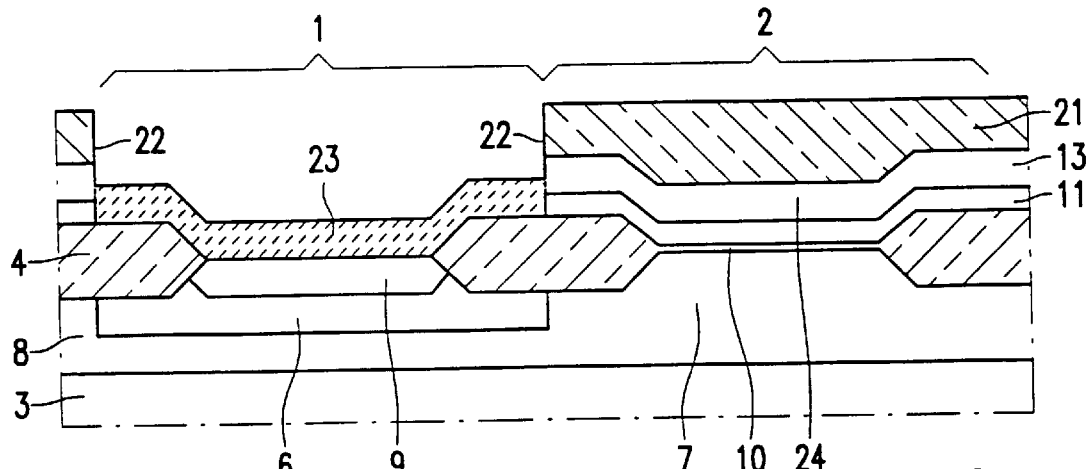
Figure 8:
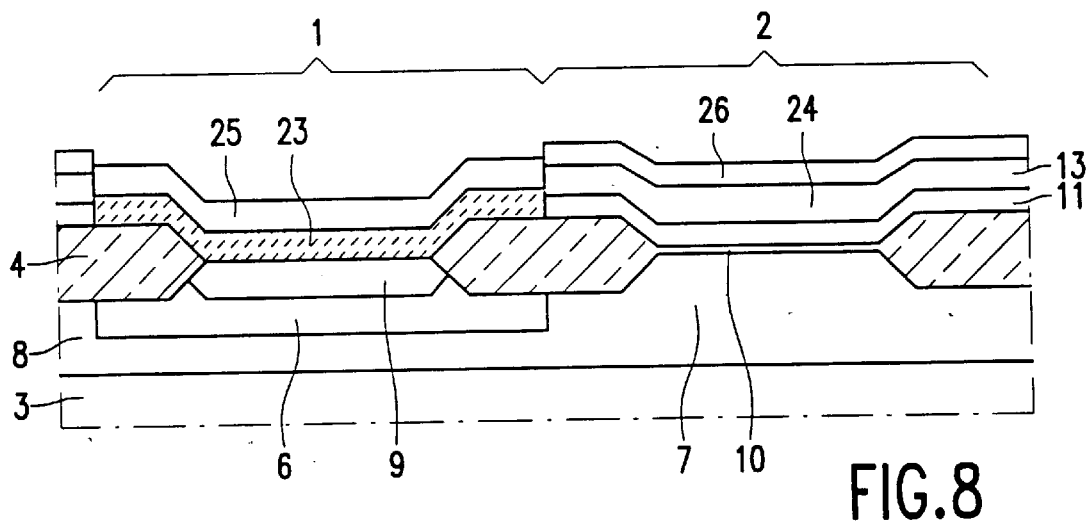
Figure 9:
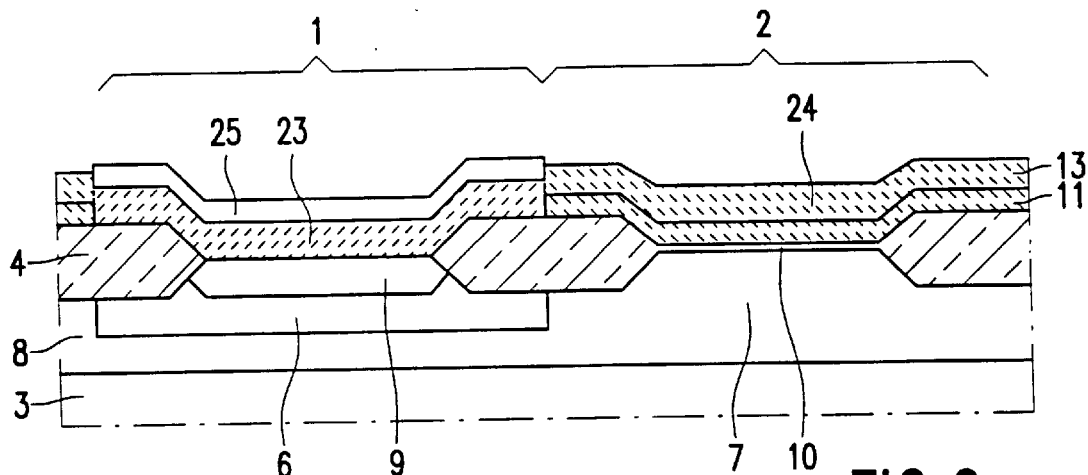
Figure 10:
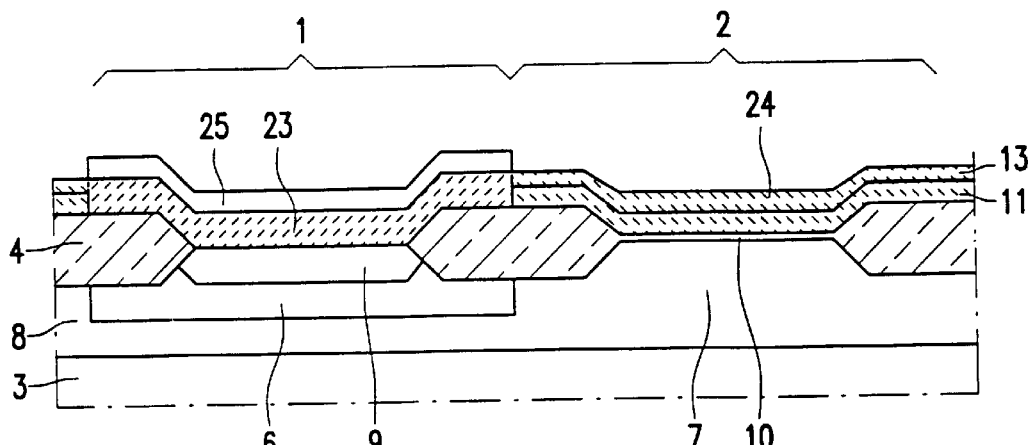

In a first embodiment of the method, the electrode layer 13 is first provided with a heavy doping at the area of the first region. The starting point here is the stage of manufacture as shown in FIG. 3. Then, as shown in FIG. 7, a photoresist mask 21 with a window 22 exposing a portion 23 of the electrode layer 13 at the area of the first semiconductor region 6 is provided on the layer of non-crystalline silicon 13. The heavy doping, in this example approximately $10^{20}$ arsenic atoms per cc, is provided in the next process step in this portion 23 in a usual manner by ion implantation. No ions are implanted into the remaining portion 24 of the layer of non-crystalline silicon 13 situated next to the portion 23, this portion 24 being shielded by the photoresist mask 21.

After the implantation, the electrode layer 13 is subjected to a usual thermal oxidation treatment. Oxide grows more quickly on the portion 23 doped with arsenic than on the undoped portion 24 of the electrode layer of non-crystalline silicon 13 during this oxidation treatment. A silicon oxide layer 25 is thus formed on the heavily arsenic-doped portion 23 of the layer of non-crystalline silicon 13 which is thicker than the silicon oxide layer 26 formed on the undoped portion 24. In this example, an approximately 250 nm thick layer of silicon oxide 25 is formed on the heavily doped portion 23 and an approximately 50 nm thick layer 26 on the lightly doped portion 24 in approximately 2 hours at a temperature of 700° C.

Subsequently, a usual oxide etching treatment is carried out until the portion 24 of the electrode layer 13 next to the portion 23 implanted with arsenic ions has become exposed again. A light doping step is then carried out whereby $10^{18}$ phosphorus atoms per cc are provided in the exposed portion 24 and the subjacent auxiliary layer 11 by means of ion implantation in this example. No ions are implanted into the portion 23 of the electrode layer 13 situated next to the portion 24, this portion 23 being shielded by the then approximately 200 nm thick silicon oxide layer 25.

Figure 4:
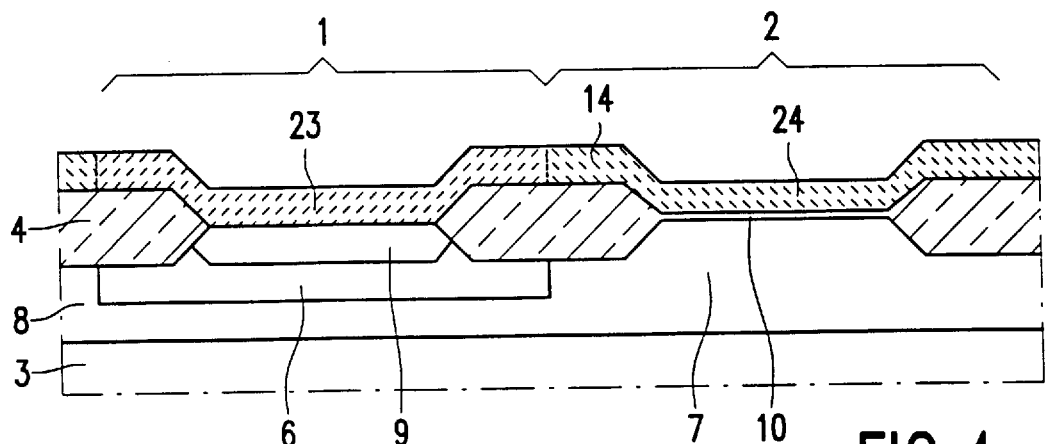
Figure 5:
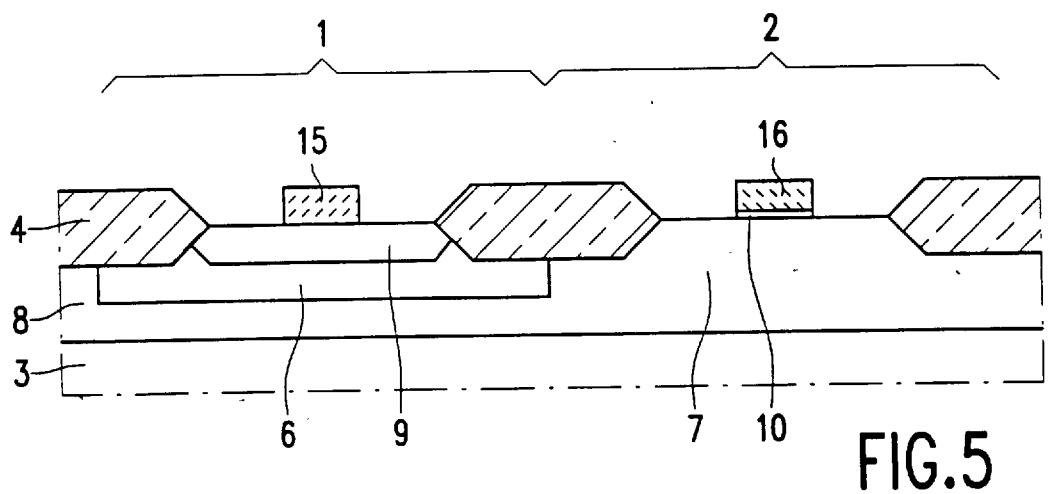
Figure 6:
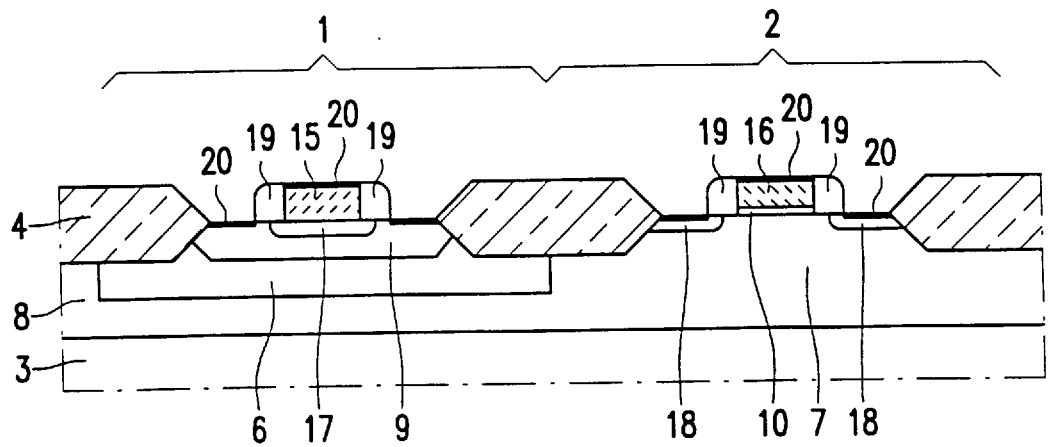

The exposed electrode layer 24 is subsequently subjected to an etching treatment until the auxiliary layer 11 and the electrode layer 13 at the area of the second region 7 together have the same thickness as the portion 23 of the electrode layer 13 at the area of the first region 6. After removal of the silicon oxide layer 25, the stage of manufacture has been reached as shown in FIG. 4, with an electrode layer 14 having a heavily doped portion 23 and a lightly doped portion 24. The subsequent manufacture of the semiconductor device then proceeds as described with reference to FIGS. 5 and 6.

A mask 21 was used for providing the heavy doping, but the subsequent process steps were carried out without mask.

Figure 2:
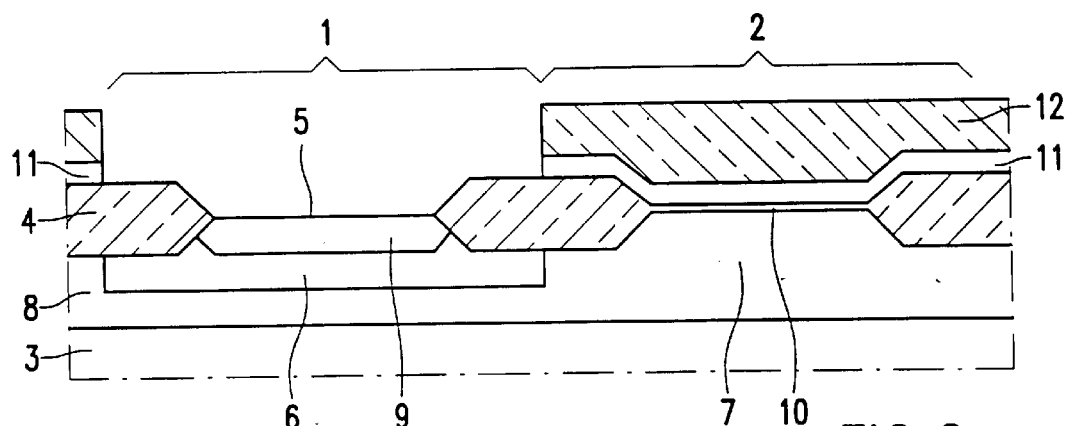
Figure 11:
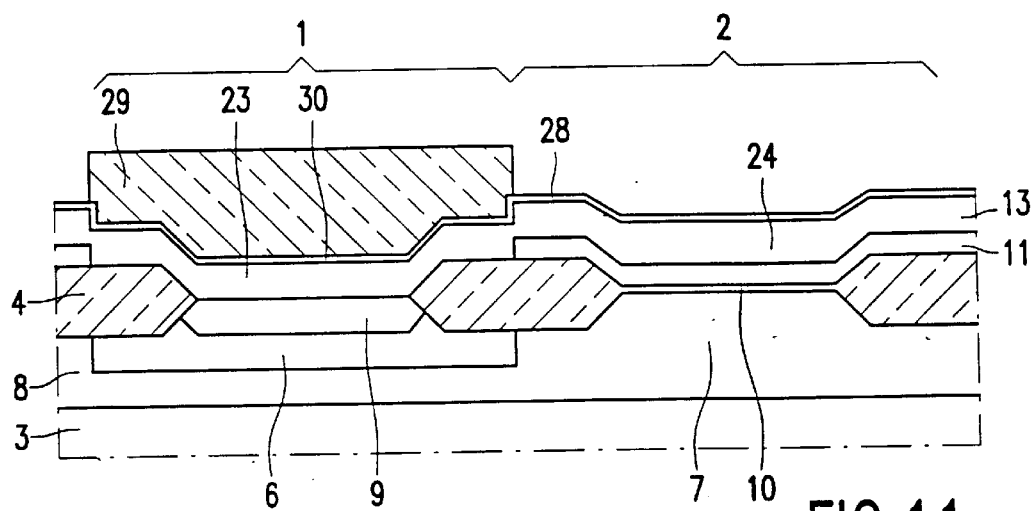
Figure 12:
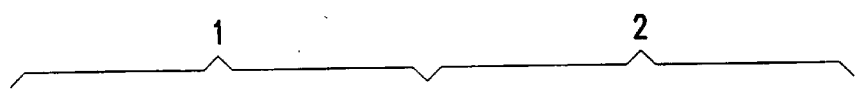
Figure 13:
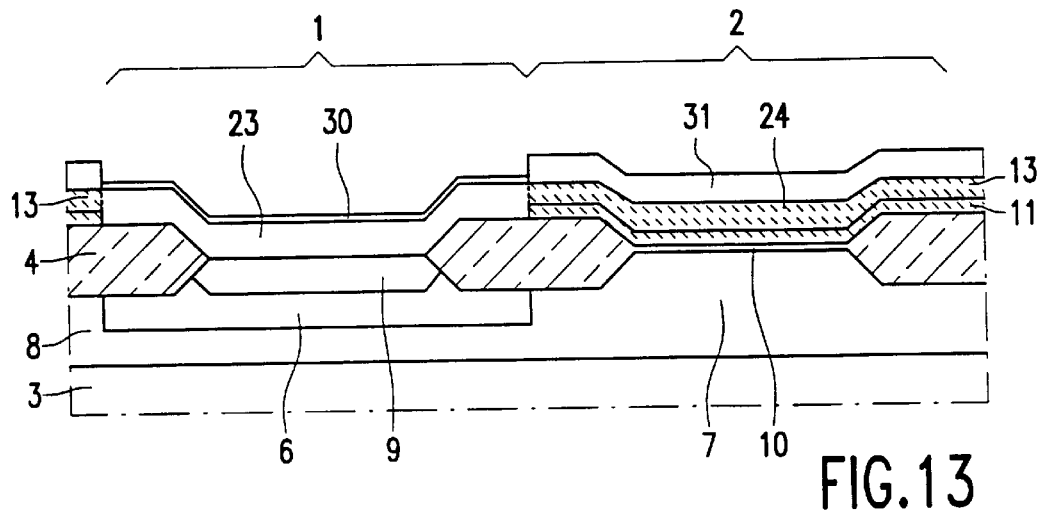
Figure 14:
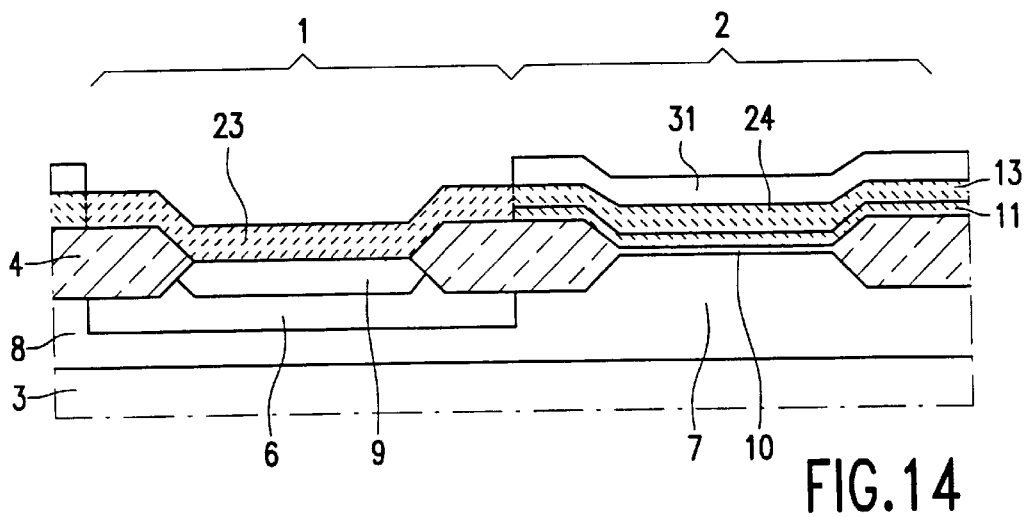

In a second embodiment of the method, during processing of the electrode layer 13, this layer is first provided with an approximately 100 nm thick silicon nitride layer 28 at the area of the first region 6. The starting point here again is the stage of manufacture as shown in FIG. 2, a silicon nitride layer 28 being first deposited on the electrode layer 13 as shown in FIG. 11, whereupon a photoresist mask 29 is provided in usual manner. This photoresist mask 29 covers a portion 30 of the silicon nitride layer 28 and the portion 23 of the electrode layer 13 at the first semiconductor region 6.

The silicon nitride layer 28 is subsequently etched away from the portion 24 of the electrode layer 13 situated next to the portion 23, after which the portion 24 is provided with the light doping, $10^{18}$ phosphorus atoms per cc being provided in the exposed portion 24 and the subjacent auxiliary layer 11 by means of ion implantation in this example. The portion 23 of the electrode layer 13 is protected here by the portion 30 of the silicon nitride layer 28, so that no phosphorus will enter the portion 23 of the electrode layer 13.

After the phosphorus doping has been provided in the portion 23 of the electrode layer 13, the semiconductor body 3 is subjected to a thermal oxidation treatment whereby an approximately 100 nm thick silicon oxide layer 31 is formed on the portion 24. After removal of the portion 30 of the silicon nitride layer 28, the portion 23 of the electrode layer 13 is provided with the heavy doping at the area of the first semiconductor region 6, $10^{\circ}$ arsenic atoms per cc being provided in this example in the exposed portion 23 by means of ion implantation. During the implantation, the silicon oxide layer 31 previously formed shields the portion 24 of the electrode layer 13 next to the first semiconductor region 6.

After removal of the silicon oxide layer 31, the stage of manufacture has been reached as shown in FIG. 4, with an electrode layer 13 having a heavily doped portion 23 and a lightly doped portion 24. The silicon oxide layer 31 is provided to such a thickness that, after removal of this layer, the auxiliary layer 11 and the electrode layer 13 together have the same thickness at the area of the second region 7 as the portion 23 of the electrode layer 13 at the area of the first region 6. The further manufacture of the semiconductor device then proceeds as described with reference to FIGS. 5 and 6.

A mask 29 was used for providing the silicon nitride layer 28 at the first semiconductor region 6, but the subsequent process steps were carried out without mask.

It is noted that the manufacture of a semiconductor device with an NPN bipolar and an NMOS transistor was described in the examples. The invention is not limited to the manufacture of such a device. A PNP and a PMOS transistor are formed when all N-type dopings are replaced with P-type dopings and all P-type dopings with N-type dopings. The light doping of the electrode layer 11 may then remain of the same conductivity type: it may always be carried out with phosphorus. This phosphorus doping in addition prevents boron entering the gate dielectric during the manufacture of the PMOS transistor. The above description relates to the manufacture of a semiconductor device comprising a single bipolar transistor and a single MOS transistor. In practice, however, the method will be used for the manufacture of a semiconductor device comprising an integrated circuit with a large number of bipolar and MOS transistors. The circuit may then comprise both NPN and PNP bipolar transistors and MOS transistors of the N-channel as well as the P-channel type.

We claim:

1. A method of manufacturing a semiconductor device with a bipolar transistor and a MOS transistor which are formed in a silicon body which is provided with a field insulation region by which semiconductor regions adjoining a surface of said body are mutually insulated, with a first region for the bipolar transistor and a second region for the MOS transistor, after which the first and second regions are consecutively provided with a gate dielectric layer and an auxiliary layer of non-crystalline silicon, whereupon the auxiliary layer and the gate dielectric layer are removed from the first region, and subsequently an electrode layer of non-crystalline silicon is deposited in said first and second regions and an emitter electrode is formed in the electrode layer on the first region and a gate electrode is formed both in the electrode layer and in the auxiliary layer on the second region, characterized in that, before the emitter electrode and the gate electrode are formed, the electrode layer is subjected to a treatment whereby a portion of non-crystalline silicon of said electrode layer is removed in a manner such that a remaining layer of non-crystalline silicon is provided at the surface of the silicon body, which remaining layer has substantially the same thickness at the first and second regions.

2. A method as claimed in claim 1, characterized in that the step whereby the remaining layer of non-crystalline silicon of substantially the same thickness is provided on the surface of the silicon body in the areas at the first and second regions followed by a treatment of the electrode layer whereby the latter is locally, i.e. at the area of the first region, provided with a dopant from which an emitter of the bipolar transistor is formed, through diffusion.

3. A method as claimed in claim 2, characterized in that a dopant is provided in the electrode layer during the treatment of this layer at the area of the first region, whereupon a thermal oxidation treatment is carried out, after which a silicon oxide formed is subjected to etching until the electrode layer 17 exposed again at the area of the second region, and the exposed electrode layer is subsequently subjected to etching until the auxiliary layer and the electrode layer together have reached the desired thickness at the area of the second region.

4. A method as claimed in claim 2, characterized in that the electrode layer is provided with a layer of silicon nitride at the area of the first region, after which a thermal oxidation of a portion of said non-crystalline silicon to form a silicon oxide layer is carried out, whereupon the silicon nitride layer and the silicon oxide formed are etched away, the silicon oxide layer being provided to a thickness such that, after removal of the silicon oxide layer, the auxiliary layer and the electrode layer together have reached the desired thickness at the area of the second region.

* * * * *